United States Patent [19]

Wilson

[11] Patent Number: 4,584,207

[45] Date of Patent: Apr. 22, 1986

[54] METHOD FOR NUCLEATING AND GROWING TUNGSTEN FILMS

[75] Inventor: Ronald H. Wilson, Schenectady, N.Y.

[73] Assignee: General Electric Company, Schenectady, N.Y.

[21] Appl. No.: 653,274

[22] Filed: Sep. 24, 1984

[51] Int. Cl.$^4$ .............................................. B05D 5/12
[52] U.S. Cl. ..................... 427/124; 204/192 S; 427/99; 427/253; 427/255; 427/255.7; 427/404
[58] Field of Search .................... 427/253, 255, 255.7, 427/91, 261, 99, 93, 404, 124; 204/192 C, 192 S, 192 D

[56] References Cited

U.S. PATENT DOCUMENTS

| | | | |
|---|---|---|---|
| 3,519,479 | 7/1970 | Inoue et al. | 427/91 |
| 3,785,862 | 1/1974 | Grill | 427/91 |
| 4,349,408 | 9/1982 | Tarng et al. | 427/253 |
| 4,383,130 | 5/1983 | Uroshevich | 204/192 S |
| 4,404,235 | 9/1983 | Tarng et al. | 427/253 |

FOREIGN PATENT DOCUMENTS 57-166027  10/1982  Japan ................................ 204/192 S

*Primary Examiner*—Sadie L. Childs
*Attorney, Agent, or Firm*—Paul E. Rochford; James C. Davis, Jr.; James Magee, Jr.

[57] ABSTRACT

Adherent deposits of tungsten are formed on receiving surfaces by preparing the receiving surface and thereafter forming a thin deposit of polycrystalline silicon on the surface. The surface and the deposited polycrystalline silicon is then exposed to a hydrogen containing tungsten fluoride gas at a suitable temperature to induce the adherent growth of tungsten film on the surface by reaction of the silicon with the tungsten fluoride gas. It is possible to form the polycrystalline silicon in a pattern on the surface and to form the tungsten deposit in the pattern in which the polycrystalline silicon had been deposited.

6 Claims, No Drawings

METHOD FOR NUCLEATING AND GROWING TUNGSTEN FILMS

BACKGROUND OF THE INVENTION

The present invention relates generally to the formation of conductive films on insulating surfaces. More particularly, it relates to formation of conductive tungsten metal films on insulating surfaces of silicon dioxide.

There is a continuous trend in the development of solid state circuitry to reduce the dimensions of the devices on insulating surfaces and in this way to increase the speed of operation. As the dimensions of devices on surfaces such as silicon wafers continue to shrink and as the speed of the operation of the circuitry continues to increase, a need is recognized for improvements in the formation of conductive films and in the production of higher conductivity films. Further, there is a recognized need for improved coverage of the topographic steps of the surfaces on which the devices are formed in order to interconnect the devices. Chemical vapor deposition of tungsten on such surfaces has been identified as a process which may be suitable for use in connection with the development and production of solid state circuitry.

However, a problem has been recognized in attempting to grow a uniform adherent film of tungsten on a surface such as a silicon dioxide surface. Where vapor deposition methods are employed, the problem relates particularly to the nucleating and growing of a uniform and adherent film. Tungsten film does not readily or reliably deposit directly onto silicon dioxide surface. To the extent that it does deposit it does not adhere to the silicon dioxide surface. This is so whether the mode of deposition is thermal vapor deposition or chemical vaporization.

There are other uses of thin films of tungsten in industry although the function and attributes of these films is not known or is not clear. For example Hewlett-Packard employs an unspecified layer under a chemically vapor deposited tungsten layer in some of their devices. This layer may be to promote adhesion of the tungsten layer. Details are not known.

Another example is the deposit of a thin layer of tungsten silicide, $WSi_2$, under the chemical vapor deposited tungsten layers of devices of a corporation trading under the name Genus. The attributes, properties and functions of this film are not known.

Intel Corp., as well as other corporations, are understood to deposit chemical vapor deposited tungsten on thick polycrystalline lines of their devices to enhance conductivity. No detailed information is available to applicant relating to such films.

Applicant is not aware of any other technology or prior art in which the objective is to replace a thin patterned deposit on a receiving surface with tungsten.

BRIEF STATEMENT OF THE INVENTION

It is, accordingly, one object of the present invention to provide a method by which a uniform adherent highly conductive film may be grown on insulating surfaces.

Another object is to provide a method of forming adherent films of tungsten on silicon dioxide insulator.

Another object is to provide a method by which tungsten metal layers may be deposited on a silicon dioxide insulating surface.

Other objects will be in part apparent and in part pointed out in the description which follows.

In one of its broader aspects these and other objects may be achieved by forming a deposit of polycrystalline silicon in a patterned array on a receiving insulating surface, exposing the surface and deposit to tungsten hexafluoride gas containing hydrogen gas to induce the deposit of tungsten on the surface in the array and to induce the strong adhesion of the tungsten deposit.

DETAILED DESCRIPTION OF THE INVENTION

The nature of the invention and the manner in which it may be carried into effect will be made clear by reference to the accompanying examples.

EXAMPLE 1

A silicon wafer is prepared to have silicon dioxide surface coating formed as an insulating protection for the underlying silicon. The insulating $SiO_2$ layer is also formed to permit deposit of conductive materials on the polycrystalline $SiO_2$.

Approximately 200 Angstroms of polycrystalline silicon were deposited by chemical vapor deposition on the silicon oxide layer formed on the outer surface of the silicon wafer in an array.

A quantity of tungsten hexafluoride was introduced with the silicon wafer at 300° C. It was the hope and expectation of the present inventor that the tungsten hexafluoride, $WF_6$, could be used in a low pressure chemical vapor deposition system to react with polycrystalline silicon to deposit an adherent layer of tungsten on the $SiO_2$ in the array while $SiF_4$ would leave as a gas.

Applicant, accordingly, attempted to form a deposit of an adherent layer of tungsten on the $SiO_2$. However, Applicant was greatly surprised to find that the 200 Angstroms of polycrystalline silicon disappeared from the surface of the $SiO_2$ but that there was no accompanying deposit of tungsten on the surface.

EXAMPLE 2

The procedure of Example 1 was employed and repeated. In this case hydrogen gas as well as tungsten hexafluoride gas was introduced into contact with the wafer and with the 200 Angstroms of polycrystalline silicon deposited on the silicon dioxide surface of the wafer. In this case, a tungsten film was deposited in place of the polycrystalline silicon and in its configuration.

The hydrogen gas apparently retards the process leading to the loss of the polycrystalline silicon. Further, the hydrogen gas evidently promotes the formation of tungsten in the areas covered by the polycrystalline silicon but does not promote the growth of tungsten on bare silicon dioxide. Accordingly, the tungsten which was deposited appeared at the site where the polycrystalline silicon layer had been present but the tungsten layer did not appear where the polycrystalline silicon layer had been absent and where only a silicon dioxide surface was available to the tungsten hexafluoride and hydrogen gas mixture. The tungsten thus deposited in the pattern and array in which the polycrystalline silicon had been present.

EXAMPLE 3

The procedure of Example 1 was employed except the polycrystalline silicon was sputtered on the silicon dioxide layer. As in Example 2, when tungsten hexafluoride and hydrogen gases were introduced a tungsten deposit appeared where the polycrystalline silicon layer had been present but the tungsten layer did not appear where the polycrystalline silicon layer had been absent and where only a silicon dioxide surface was available to the gases.

DISCUSSION OF VARIABLES

The deposition described in Examples 2 and 3 occurred between approximately 225° C. and 325° C. At lower temperatures the replacement reaction occurs at a much lower rate. At higher temperatures the deposition of tungsten occurs on the silicon dioxide in the absence of polycrystalline silicon.

The reactions occur when the partial pressures of hydrogen and tungsten hexafluoride are in the ratio of approximately 200 to 1 down to approximately 5 to 1.

The total pressure in the system was in the range of 0.1 Torr to 2 Torr.

The thickness of the polycrystalline silicon layer was in the range of 100 Angstroms to 400 Angstroms.

The temperature and the gas composition are two variables which are important to control of the process.

The deposit of polycrystalline silicon is instrumental in causing the deposit of the tungsten. The locations where the tungsten does deposit relate to the locations where the polycrystalline material has been deposited before the exposure to the tungsten hexafluoride. It is feasible to employ the presence of the polycrystalline silicon to promote the adherent growth of tungsten. It is feasible to completely coat the surface to receive the tungsten and in this way to promote the adherent growth of tungsten on all of the wafer surfaces.

Alternatively, the deposit of silicon on the wafer surface can be patterned to promote the growth of the adherent tungsten film in selective areas of the wafer.

It is noteworthy that the layer of silicon to which the tungsten hexafluoride is exposed is only approximately 200 Angstroms and that it is, accordingly, very thin. Because it is so thin, it appears possible to deposit the polycrystalline silicon and etch it in very fine patterns on a suitable receiving surface, such as the silicon dioxide surface and to cause the generation of adherent tungsten films by employing the steps of the process as described herein.

Other methods or materials for producing the very thin surface films on a receiving surface can be employed in connection with the practice of the present invention.

Further, it is possible to use the process for other purposes.

What is claimed and sought to be protected by Letters Patent of the United States is as follows:

1. A method for forming an adherent patterned deposit of highly conductive tungsten metal on an insulating surface which comprises
   providing a receiving silicon dioxide surface,
   forming a very thin deposit of polycrystalline silicon in a pattern on that silicon dioxide receiving surface,
   exposing the surface with the deposited polycrystalline silicon to tungsten hexafluoride gas containing hydrogen gas to induce the removal of the polycrystalline silicon and the replacement of the polycrystalline silicon pattern with a deposit of tungsten in a pattern corresponding to that of the pattern of polycrystalline silicon which is replaced, and the strong adhesion of the deposit of tungsten to the surface.

2. A method of forming a patterned adherent layer of highly conductive tungsten metal on a silicon oxide surface layer which comprises,
   providing a wafer of silicon,
   forming an insulating layer of silicon dioxide on a surface of said silicon wafer,
   depositing a very thin layer of polycrystalline silicon on said silicon dioxide surface,
   developing a configuration of very fine patterns in said polycrystalline silicon layer on said silicon dioxide surface, and
   forming a highly adherent layer of tungsten metal in the configuration of said very fine patterns by exposing the surface bearing the very thin layer of polysilicon to tungsten hexafluoride and hydrogen gas at a temperature between 225° C. and 325° C. to remove the polysilicon and replace it by tungsten metal.

3. The method of claim 2 wherein the very thin layer of polycrystalline silicon is between 100 and 400 Angstroms.

4. The method of claim 2 wherein the very thin layer of polycrystalline silicon is about 200 Angstroms.

5. The method of claim 2 wherein the very thin layer of silicon is formed by chemical vapor deposition.

6. The method of claim 2 wherein the very thin layer of polycrystalline silicon is formed by sputtering.

* * * * *